United States Patent [19]

Kitano et al.

[11] Patent Number: 5,539,250
[45] Date of Patent: Jul. 23, 1996

[54] PLASTIC-MOLDED-TYPE SEMICONDUCTOR DEVICE

[75] Inventors: Makoto Kitano, Tsuchiura; Asao Nishimura, Ushiku; Akihiro Yaguchi, Ibaraki-ken; Ryuji Kohno, Ibaraki-ken; Nae Yoneda, Ibaraki-ken, all of Japan

[73] Assignee: Hitachi, Ltd., Tokyo, Japan

[21] Appl. No.: 713,100

[22] Filed: Jun. 11, 1991

[30] Foreign Application Priority Data

Jun. 15, 1990 [JP] Japan ................................ 2-155167

[51] Int. Cl.⁶ .................................................... H01L 23/34
[52] U.S. Cl. ......................... 257/666; 257/723; 257/725; 257/787
[58] Field of Search ................................ 357/74, 75, 84; 257/666, 758, 723, 787, 725, 790

[56] References Cited

U.S. PATENT DOCUMENTS

| | | | |
|---|---|---|---|
| 3,893,158 | 7/1975 | Lincoln | 357/19 |
| 4,005,456 | 1/1977 | Botzenhardt | 257/753 |
| 4,486,945 | 12/1984 | Aigoo | 257/666 |
| 4,541,003 | 9/1985 | Otsuka et al. | 357/84 |
| 4,862,322 | 8/1989 | Bickford et al. | 357/75 |
| 4,965,654 | 10/1990 | Karner et al. | 357/70 |
| 5,068,712 | 11/1991 | Murakami et al. | 357/72 |
| 5,332,922 | 7/1994 | Oguchi et al. | 257/723 |

FOREIGN PATENT DOCUMENTS

| | | |
|---|---|---|
| 0340527A | 4/1989 | European Pat. Off. . |
| 59-229850 | 12/1984 | Japan . |
| 62-024650 | 2/1987 | Japan . |
| 1-077135 | 3/1989 | Japan . |
| 2-246125 | 1/1990 | Japan . |

*Primary Examiner*—Rolf Hille
*Assistant Examiner*—Roy Potter
*Attorney, Agent, or Firm*—Antonelli, Terry Stout & Kraus

[57] ABSTRACT

A plastic-molded-type semiconductor device is provided wherein two semiconductor chips, having main surfaces on which electrodes and circuits are formed, are arranged to face each other. A lead frame is placed between these two semiconductor chips and electrically connected to their electrodes, and a plastic package is formed by plastic-sealing the above components. To provide for secure and convenient electrical connections between the electrodes on the semiconductor chips and the lead frame, wiring patterns are provided on the main surfaces of the semiconductor chips through the intermediation of insulating films. With this structure, it is possible for two large-sized semiconductor chips having electrodes in their middle sections to be encased in a single, relatively thin package.

22 Claims, 10 Drawing Sheets

PLASTIC-MOLDED-TYPE SEMICONDUCTOR DEVICE

BACKGROUND OF THE INVENTION

1. Field of the Invention

This invention relates to a package structure for a plastic-molded-type semiconductor device suitable for attaining a higher level of device integration.

2. Description of the Prior Art

Combining two or more semiconductor chips in a single packaged unit is very effective in attaining a higher level of device integration. Further, in the case of inferior product yield, a substantial improvement in terms of product yield is achieved by combining good chips as compared to the case where one device having the same area as that of the two or more chips is packaged.

The combining of two semiconductor chips in a single packaged unit can be effected by attaching the chips to either side of a metal plate called a "chip pad". The "chip pad" constitutes a part of a lead frame, the electrodes of the respective chips being connected to the leads through wires, as disclosed in Japanese Patent Unexamined Publication Nos. 62-131555 and 62-8529. Apart from this, there is a method in which lead frames are joined with each other within a single package, as disclosed in Japanese Patent Unexamined Publication No. 62-119952, and a method in which a two-staged lead frame is plastic-molded, as disclosed in Japanese Patent Unexamined Publication No. 63-124450. Further, although it is difficult to regard it as one packaged unit, there is a method in which two packaged units are joined together, substantially constituting a "single" unit, as disclosed in Japanese Patent Unexamined Publication No. 62-16552.

These prior-art techniques, however, have not been put into practical use because of the following problems:

In the structure in which the chips are mounted on either side of a chip pad, the wire bonding of the chip electrodes to the lead frame is first performed on one side, and then, must be done on the other side. In this process, it is very difficult to effect the wire bonding on the second side without damaging the wires used on the first side.

The problem with the method in which lead frames are joined with each other within a single package is that it requires an excessively large receptacle.

The plastic-molding of a two-staged lead frame is very difficult to perform. No technique for this has yet been developed yet utilizing an ordinary transfer mold on a mass-production basis.

It is certainly easy to join two packaged units together into a single unit. This, however, requires a thick package, so the idea is of no great value from the viewpoint of attaining a higher level of device integration.

In the above prior-art techniques, the leads, positioned in the vicinity of the side surfaces of the semiconductor chips, are connected to the electrodes of these chips through wires, so that the positions of the electrodes are restricted to the peripheral sections of the chips. As a result, these prior-art techniques cannot be applied to semiconductor chips which are to be used in encasing a structure in which the leads extend up to the upper surface of the chip (hereinafter referred to as the "LOC (Lead-On-Chip) structure"), as shown in FIG. 17. That is, these techniques cannot be applied in a case where two semiconductor chips whose electrodes are provided are to be encased into a single unit.

Further, when connecting leads, positioned in the vicinity of the side surfaces of the chips to the electrodes through wires, a suitable dimension is needed between the side surfaces of the chips and those of the package, with the result that the encasement of relatively large-sized chips cannot be effected efficiently. In addition, no consideration has been given in these known examples to a reduction in package thickness.

SUMMARY OF THE INVENTION

It is accordingly an object of this invention to provide an encasement structure which is thin and suitable for mass production, and which is adequate to enclose two large-sized chips whose electrodes are situated approximately.

In order to achieve the above and other objects, the package of the present invention is constituted as follows:

First, an insulating film having a metal wiring pattern is attached to that surface of a semiconductor chip on which a circuit is formed.

Then, the wiring pattern is electrically connected to the electrodes of the chip through wires or the like.

Two semiconductor chips prepared in this way are arranged in such a manner that those surfaces of the chips having a wiring pattern face each other, with a lead frame being placed therebetween.

Subsequently, the wiring patterns are electrically connected to the lead frame by soldering or the like.

Finally, the two semiconductor chips and that part of the lead frame positioned between the chips are plastic-molded, and then the outer leads of the lead frame are shaped appropriately.

In the package of the present invention, a wiring pattern with an arbitrarily designed configuration is used, so that electrodes of the chips and the lead frame can be electrically connected to each other at arbitrary positions. Thus, even when two chips having electrodes arranged near the chips' center lines are used, as is the case with a LOC package, they can be encased in a single package.

Further, since there are no electrically connecting members between the side surfaces of the chips and those of the package, the chips may extend up to the vicinity of the external contour of the package, thus attaining a higher level of integration.

The increase in thickness as a result of adopting the encasement process of this invention as compared to conventional single-chip packaging is basically no more than that attributable to the thickness of the additional chip itself. Thus, this invention is advantageous with respect to the overall package having less thickness than prior art arrangements for encasing two chips.

Further, since it allows direct application of conventional techniques, such as the manufacturing technique for LOC packages and the tape-automated bonding technique, this kind of packaging is suitable for mass production.

Constructed as described above, the present invention provides the following advantages:

Due to the fact that the wiring pattern is provided on the semiconductor chip, two chips whose electrodes are in the middle sections thereof can be encased in a single package;

Since there is no need to provide electrically connecting members between the side surfaces of the chip and those of the package, chips of a larger size can be encased; and The thickness of the plastic-molded-type semiconductor device of this invention can be as small as 1.1 mm.

DETAILED DESCRIPTION OF THE PREFERRED EMBODIMENTS

Embodiments of the present invention will now be described with reference to the accompanying drawings.

Figure 1:
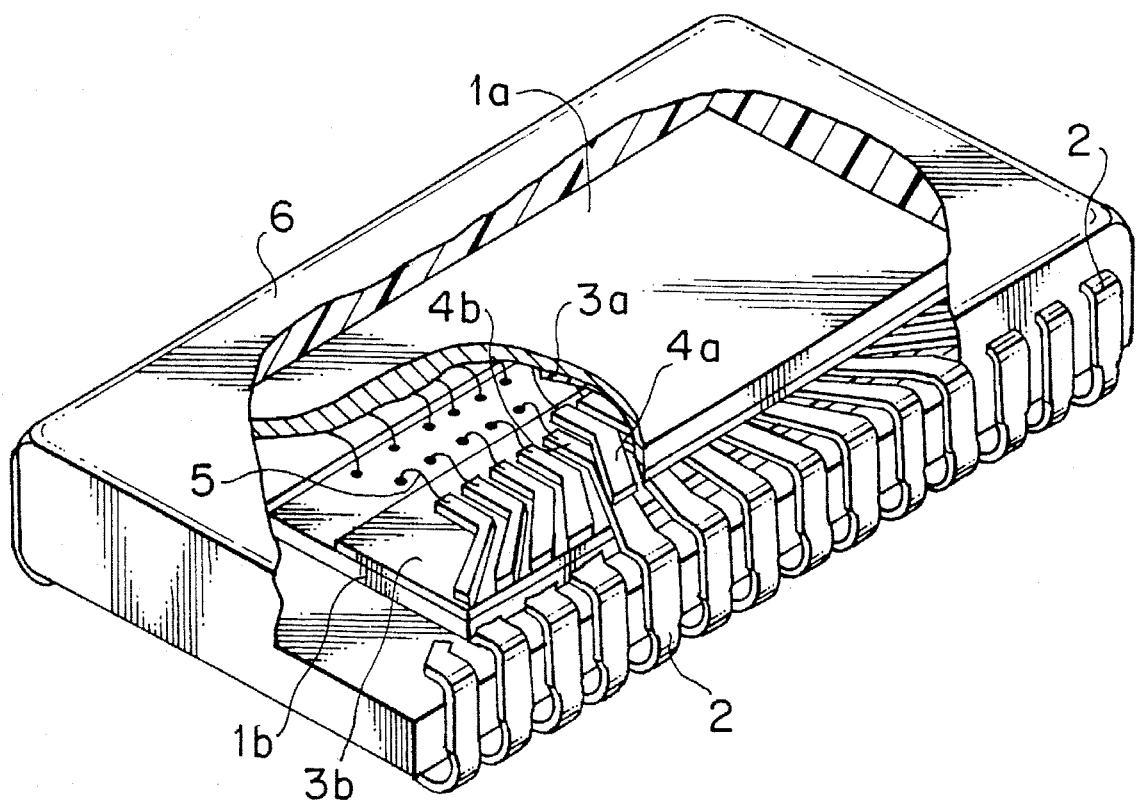
FIG. 1 is a partially cutaway perspective view of a plastic-molded-type semiconductor device in accordance with a first embodiment of the present invention.
Figure 2:
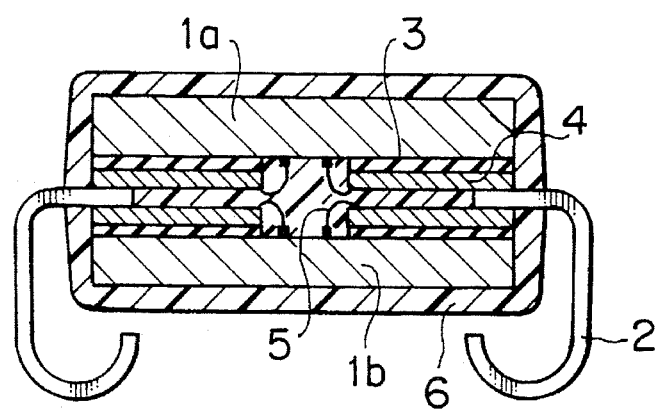
FIG. 2 is a sectional view of the same.
Figure 3:
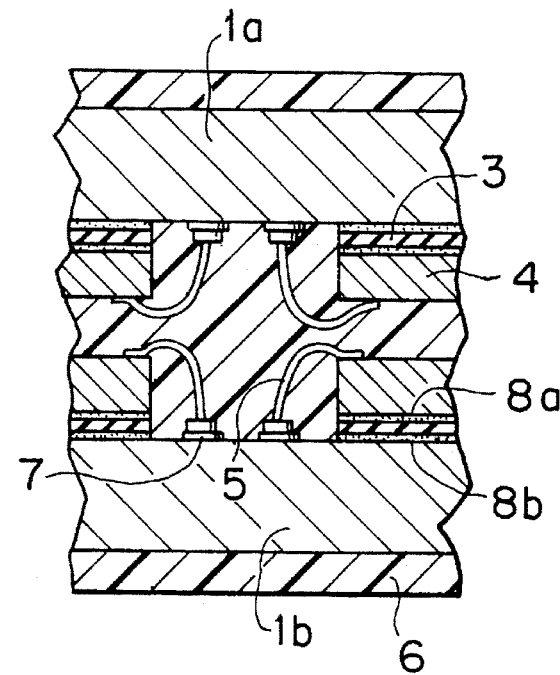
FIG. 3 is an enlarged sectional view showing a portion around electrodes of this plastic-molded-type semiconductor device.
Figure 4:
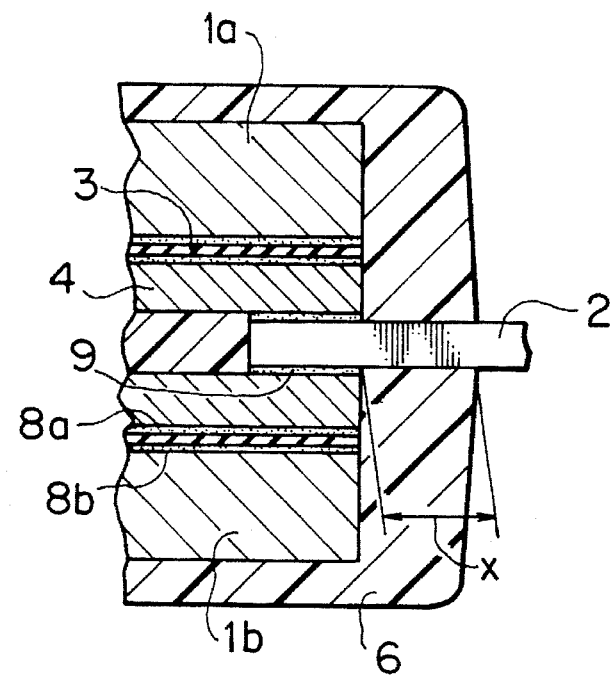
FIG. 4 is an enlarged sectional view showing a portion around a side surface of the package of this plastic-molded-type semiconductor device.

FIG. 1 is a partially sectional, perspective view schematically showing the structure of a plastic-molded-type semiconductor device in accordance with the first embodiment of this invention; FIG. 2 is a cross-sectional view of a middle section of the same; FIG. 3 is an enlarged view of the central section of the plastic-molded-type semiconductor device shown in FIG. 1; and FIG. 4 is an enlarged sectional view of a portion around a side surface of this device. In this embodiment, two semiconductor chips 1a and 1b, facing each other, are encased in a single package. By means of adhesive layers 8b (which are omitted in FIGS. 1 and 2), insulating films 3 (3a and 3b) are respectively attached to those surfaces of the chips 1a and 1b on which circuits are formed, and, by means of adhesive layers 8a (which are omitted in FIGS. 1 and 2), wiring patterns 4 (4a and 4b) are respectively attached to the insulating films 3. Electrodes 7 (which are omitted in FIGS. 1 and 2) provided in the middle sections of the chips 1a and 1b are electrically connected to the wiring patterns 4 through wires 5. In each portion around a side surface of the package, the wiring patterns 4 are connected to a lead frame 2 through the intermediation of electrical conductive adhesive layers 9 (which are omitted in FIGS. 1 and 2). These above components are encapsulated by plastic encapsulant 6.

Figure 5:
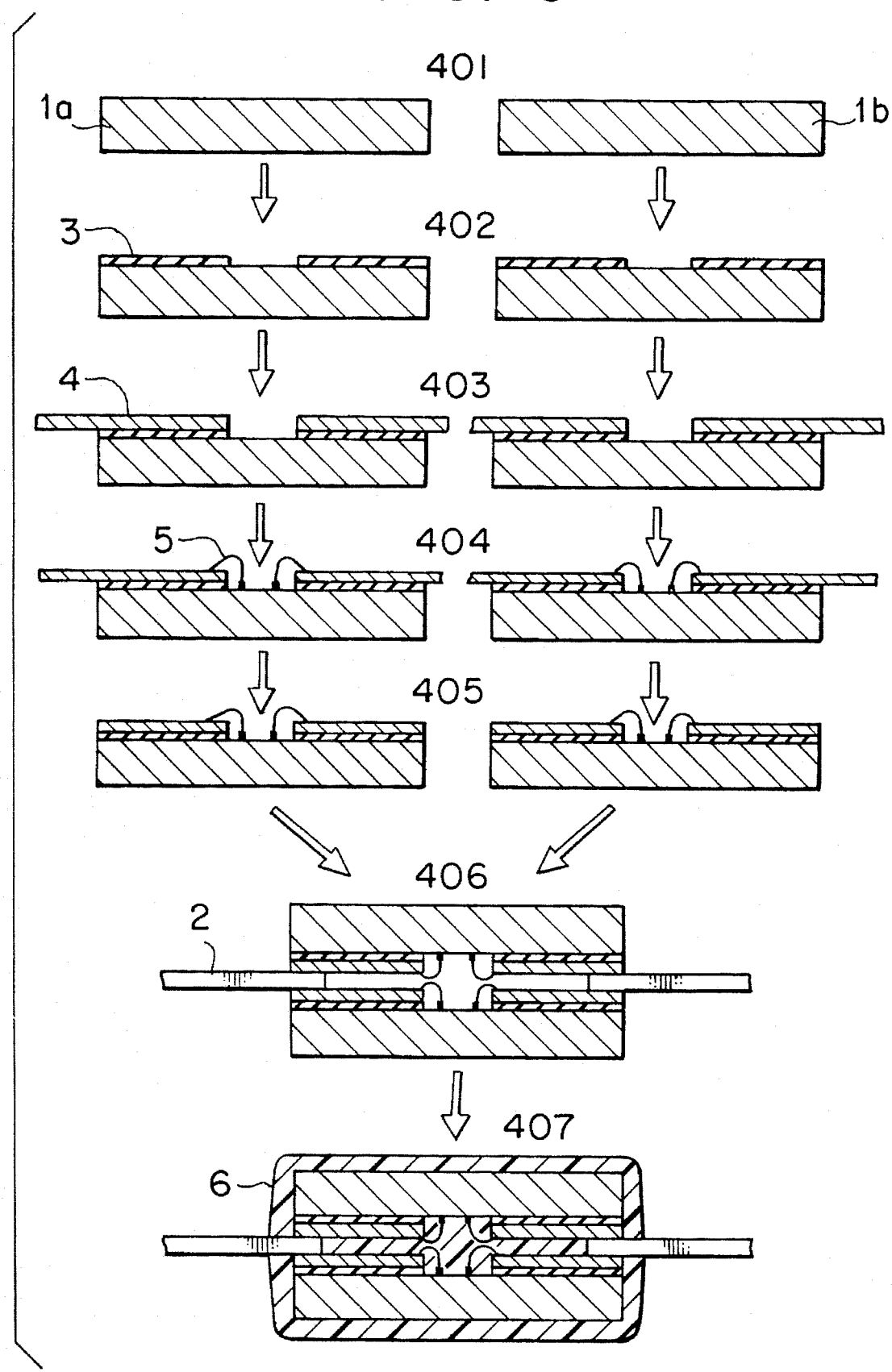
FIG. 5 is a diagram illustrating a method of producing the plastic-molded-type semiconductor device of the first embodiment.

FIG. 5 shows a method of producing the semiconductor device of this embodiment. First, the two semiconductor chips 1a and 1b to be encased are prepared (Step 401), and insulating films 3 are attached to surfaces of the chips on which circuits are formed (Step 402). Polyimide is an example of a suitable material to be used for the insulating layers. The adhesive used may, for example, be of an epoxy-resin type. Then, the wiring patterns 4 which are already formed in a pattern are attached to the insulating films 3 (Step 403). In this embodiment, the thickness of the wiring patterns 4 is the same as that of the lead frame being used. Subsequently, the electrodes (which are omitted in FIG. 5) of the semiconductor chips 1a and 1b are electrically connected to the wiring patterns 4 through the wires 5 (Step 404). Afterwards, those portions of the wiring patterns 4 extending beyond the chips are cut off (Step 405). The sequence of the steps (404) and (405) may be reversed. The two chips thus prepared are arranged to face each other, with a lead frame 2 placed therebetween, and the wiring patterns 4 and the lead frame 2 are electrically connected to each other (Step 406). This connection may, for example, be effected by soldering. In a semiconductor device of this type, it may happen that the package will be heated up to a temperature of about 250° C. when leads are mounted by soldering on a printed circuit board on which this semiconductor chip is arranged. Accordingly, it is desirable that the melting point of the solder used for connecting the lead frame 2 to the wiring patterns 4 not be lower than 250° C. Alternatively, this connection may be effected by using a electrically conductive resin such as silver paste. Finally, these above components are encapsulated by plastic encapsulant 6 (Step 407), and those portions of the lead frame 2 outside the package are appropriately shaped. In this way, a semiconductor device as shown in FIG. 1 can be obtained.

Thus, in accordance with this embodiment, two semiconductor chips with electrodes formed by a prior-art technique in the middle sections thereof can be encased in a single package. Further, since there is no need to provide electrically connecting members in the sections between the side surfaces of the semiconductor chips 1a and 1b and those of the package, the width of these sections (indicated by a size "x" in FIG. 4) can be reduced to the lowest possible level at which the plastic encapsulant does not suffer disruption (which is usually about 0.8 mm). Thus, relatively large-sized chips can be encased.

Figure 6:
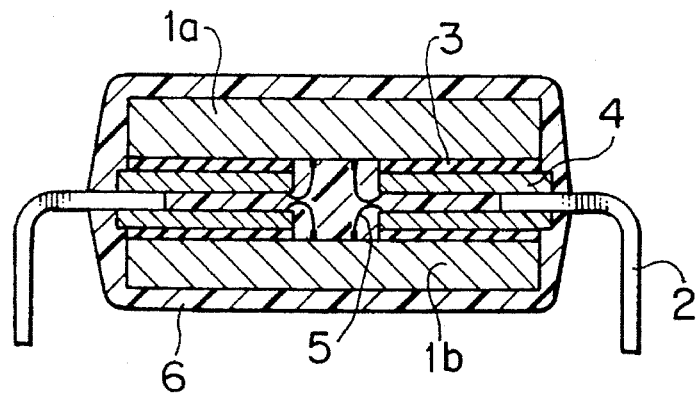
FIGS. 6 through 11 are sectional views showing plastic-molded-type semiconductor devices which are partial modifications of the first embodiment.
Figure 7:
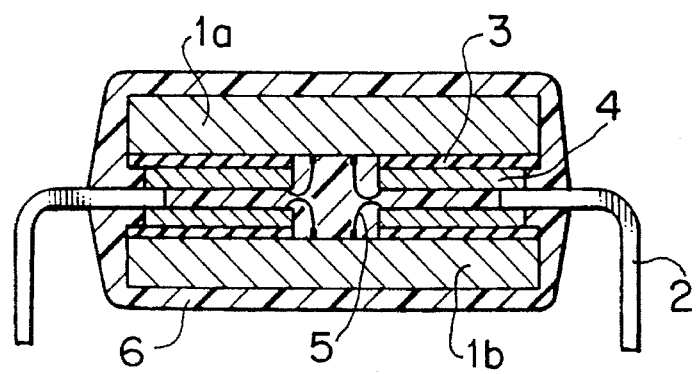

While in the example shown in FIG. 2 the end surfaces of the wiring patterns 4 are flush with those of the semiconductor chips 1a and 1b, the wiring patterns 4 may also extend beyond the end surfaces of the chips, as shown in FIG. 6, or they may be cut at or extend to a point short of these end surfaces, as shown in FIG. 7.

Figure 8:
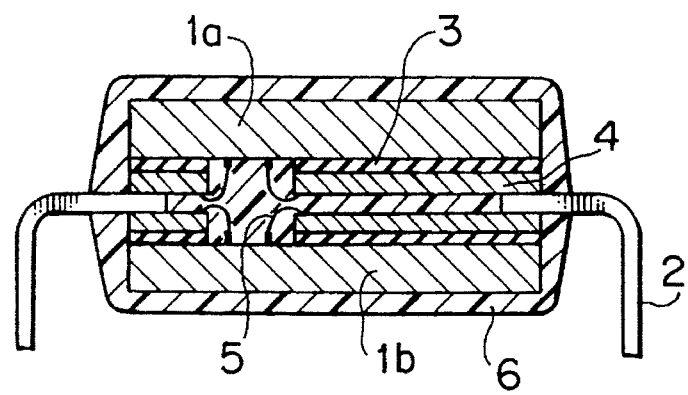
Figure 9:
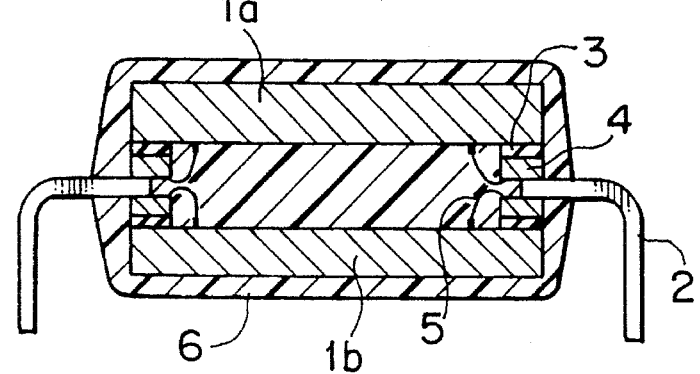

Further, while in the example shown in FIG. 2 the electrodes 7 of the semiconductor chips 1a and 1b are arranged in the middle sections thereof, it is also possible for these electrodes to be offset, as shown in FIG. 8, or arranged in the peripheral section of the chips, as shown in FIG. 9.

Figure 10:
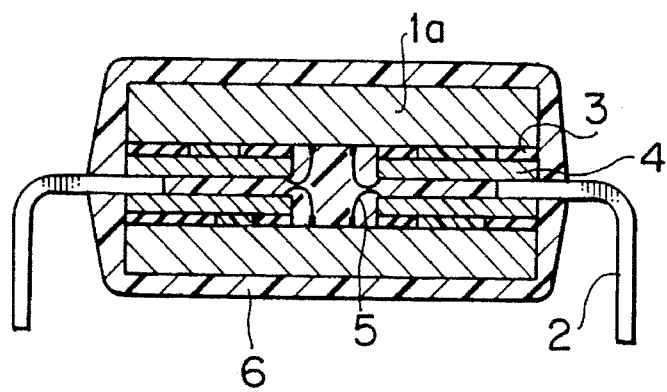
Figure 11:
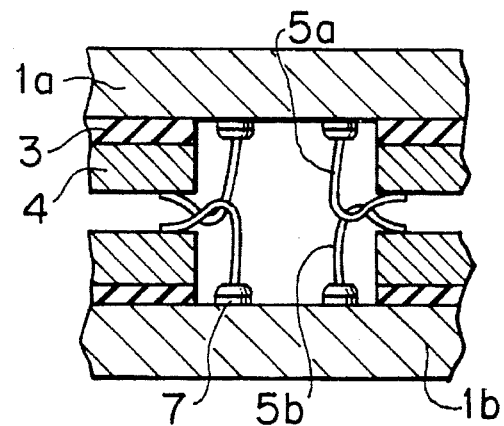

The insulating films 3 may be divided into several parts, as shown in FIG. 10. Further, in a case where the distance between the wiring patterns is small and there is a fear that the wires will come into contact with each other, these wires 5a and 5b may be arranged alternately, as shown in FIG. 11.

Figure 12:
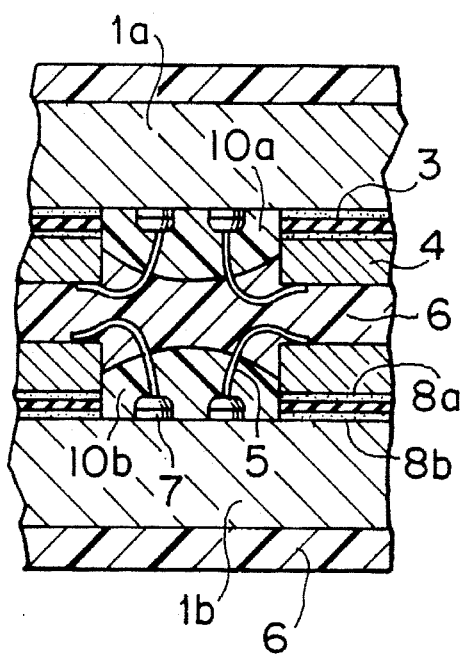
FIG. 12 is an enlarged sectional view showing a part of a plastic-molded-type semiconductor device in accordance with a second embodiment of this invention.

FIG. 12 is an enlarged sectional view showing a plastic-molded-type semiconductor device in accordance with the second embodiment of the present invention. The drawing shows a portion of the device around electrodes thereof. In addition to the construction of the first embodiment, this embodiment adopts a structure in which the electrodes 7 and the wires 5 are partly covered with a first resin 10a and 10b. The covering with this first resin 10a and 10b is effected in the step (404) or (405) of the process shown in FIG. 5. By thus covering the electrodes 7 with resin, these electrodes 7 can be protected from corrosion, so that the wiring patterns and the lead frame can be soldered to each other by using flux, thus facilitating the production process.

Figure 13:
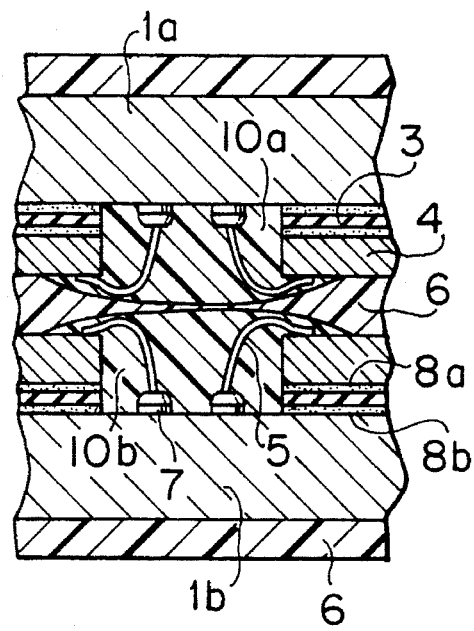
FIG. 13 is an enlarged sectional view showing a part of a partial modification of the plastic-molded-type semiconductor device of the second embodiment.

It is possible for this first resin 10a and 10b to cover not only the electrodes but also all of the wires 5, as shown in FIG. 13.

The first resin 10a and 10b may be of the same kind of material as a second resin plastic encapsulant 6, which is used for the encapsulating of the entire unit. Alternatively, it may be a soft resin such as silicon gel. In any case, the first resin used must have a satisfactory adhesiveness with respect to those surfaces of the semiconductor chips 1a and 1b on which circuits are formed.

Figure 14:
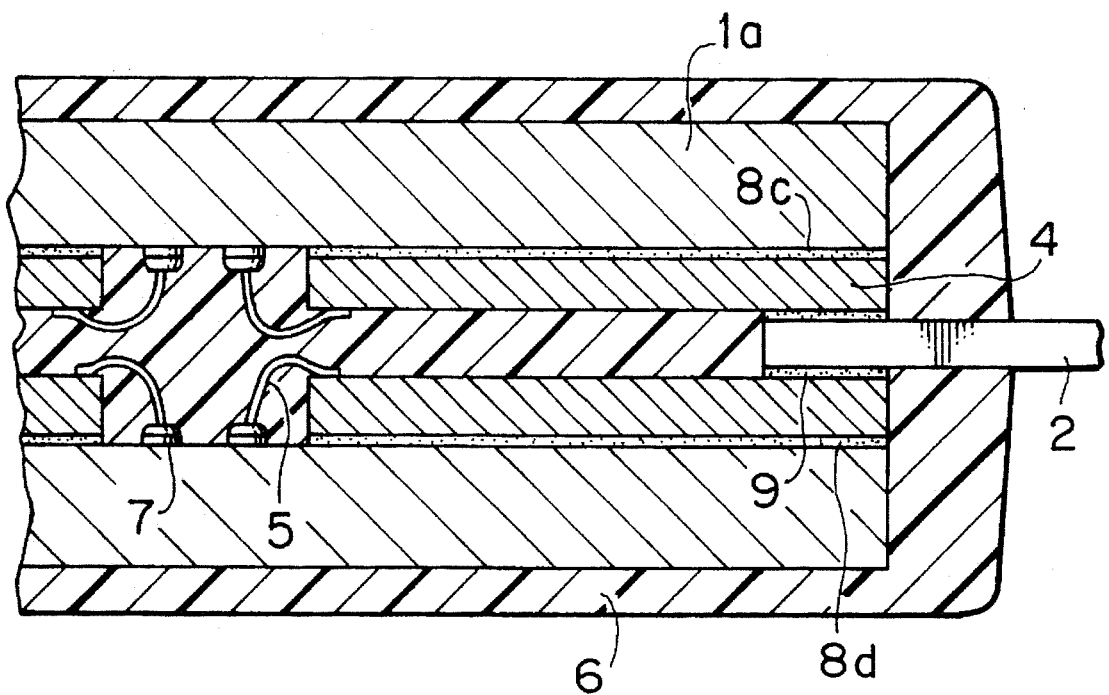
FIG. 14 is an enlarged sectional view showing a part of a plastic-molded-type semiconductor device in accordance with a third embodiment of this invention.

FIG. 14 is a sectional view showing a part of a plastic-molded-type semiconductor device in accordance with the third embodiment of the present invention. In this embodiment, the adhesive layers 8c and 8d also serve as the insulating films, which means the insulating films 3 can be omitted. Thus, due to this arrangement, the thickness of the package can be reduced by double the thickness of the insulating film 3. In this embodiment, the electrical insulation between the circuits on the semiconductor chips 1a and 1b and the wiring patterns is ensured, so that the arrangement of this embodiment is particularly effective in a case where a protective film of polyimide or the like is formed on the surfaces of the chips.

Figure 15:
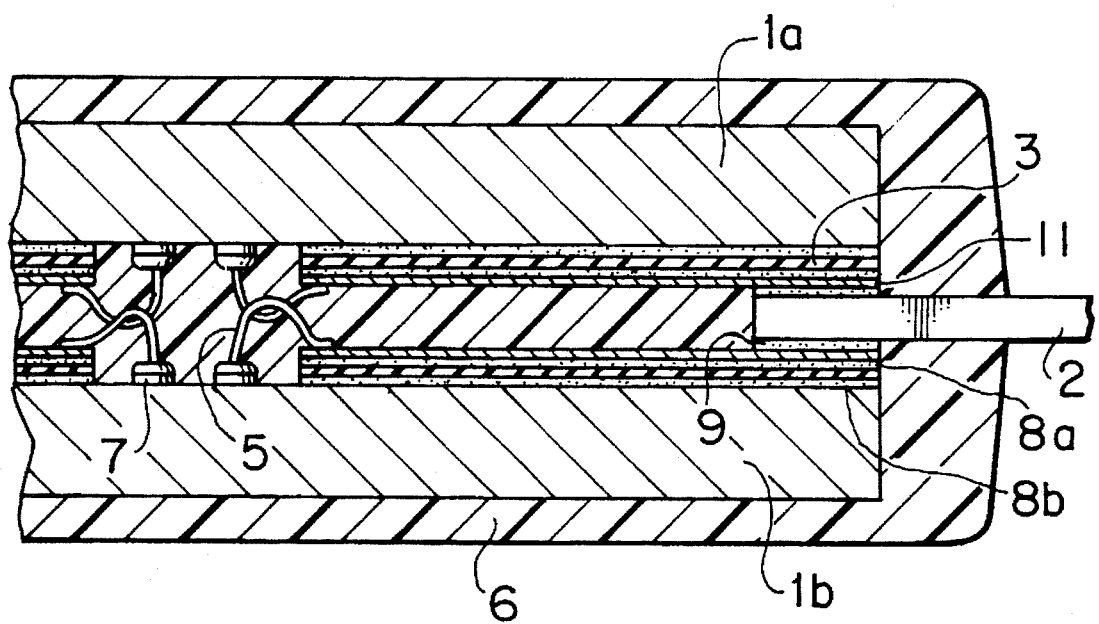
FIG. 15 is an enlarged sectional view showing a part of a plastic-molded-type semiconductor device in accordance with a fourth embodiment of this invention.

FIG. 15 is a sectional view showing a part of a plastic-molded-type semiconductor device in accordance with the fourth embodiment of the present invention. In this embodiment, metallic foils 11 are employed as the wiring patterns, so that the package can have a relatively reduced thickness. It is difficult to attach patterned metallic foils to the insulating films 3, so, instead of doing this, the patterning of the metallic foils may be effectively performed by etching after attaching the foils to the films, as is practiced in the tape-automated bonding technique. After attaching the films, which have thus been patterned in this embodiment, to the chips 1a and 1b, the plastic-molded-type semiconductor device of this embodiment can be produced according to the procedures following the steps (404) shown in FIG. 5. Copper is an example of the material which can be used for the metallic foils.

Figure 16:
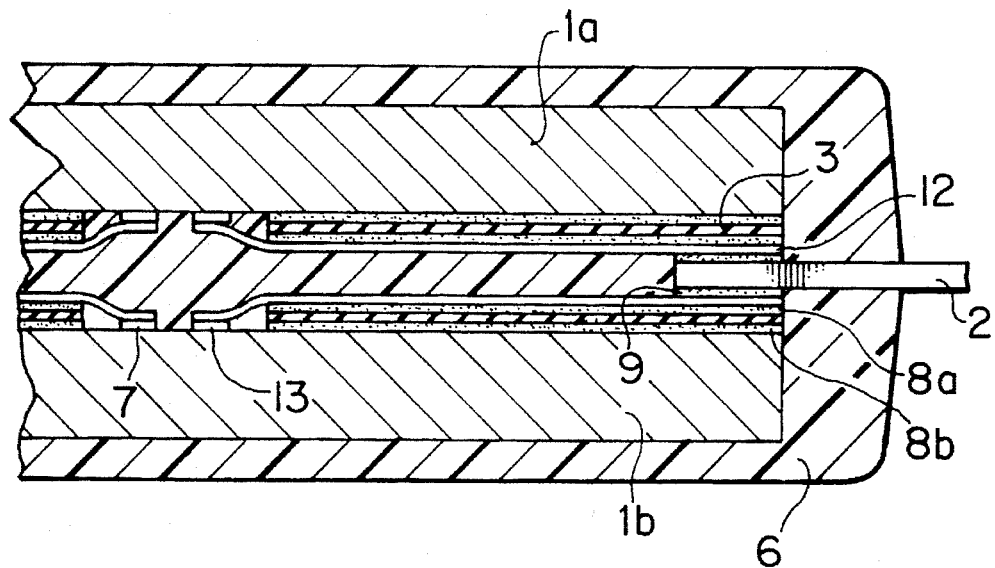
FIG. 16 is an enlarged sectional view showing a part of a plastic-molded-type semiconductor device in accordance with a fifth embodiment of this invention.
Figure 17:
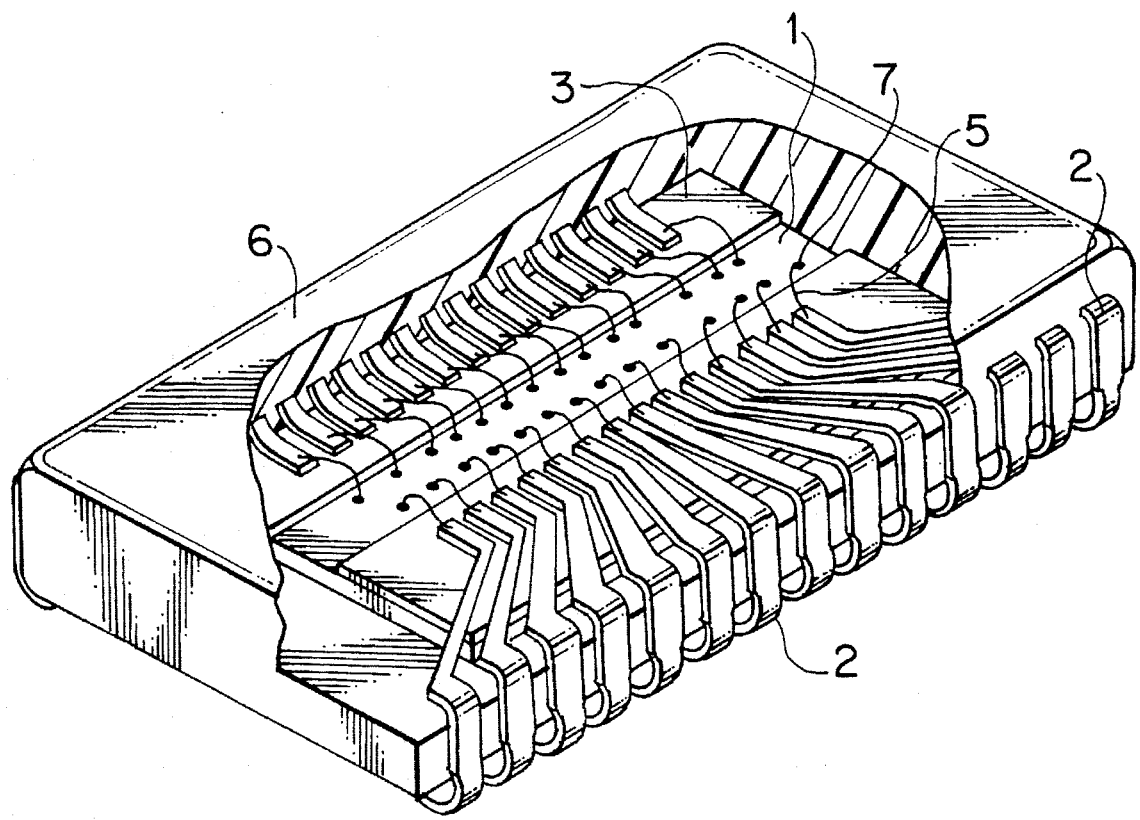
FIG. 17 is a perspective view showing the internal structure of a conventional lead-on-chip package.

FIG. 16 is a sectional view showing a part of a plastic-molded-type semiconductor device in accordance with the fifth embodiment of the present invention. In this embodiment, metallic foils 12 are used as the wiring patterns. In the vicinity of the device electrodes 7, certain portions 13 of these metallic foils 12 extend beyond the insulating films 3, and these portions 13 are electrically connected to the electrodes 7 by thermocompression bonding through the intermediation of solder, gold/silicon eutectic alloy, etc. In this package structure, no wires are needed, so that there is no need to secure the dimension corresponding to the height of the wires. This makes it possible to further reduce the thickness of the package as compared to the fourth embodiment. An estimated package thickness in this embodiment when using the present packaging technique is as small as 1.1 mm. The connection between the metallic foils 13 and the electrodes 7 can be easily effected by adopting the tape-automated bonding technique.

The above embodiments of this invention can be adequately applied to memory ICs. In particular, they can be very effectively applied to a 64 Mbit DRAM, which has the highest degree of integration at present. It will be described in the following how the first embodiment of the present invention can be applied to a 64 Mbit DRAM.

As shown in FIGS. 1 and 2, DRAM chips 1a and 1b are sealed in an SOJ (Small Out-line J-bend) type plastic-molding package.

The DRAM has a large capacity of 64 Mbits ×1 bit and is sealed in a plastic-molding type package of 300 mil ×850 mil.

Figure 18:
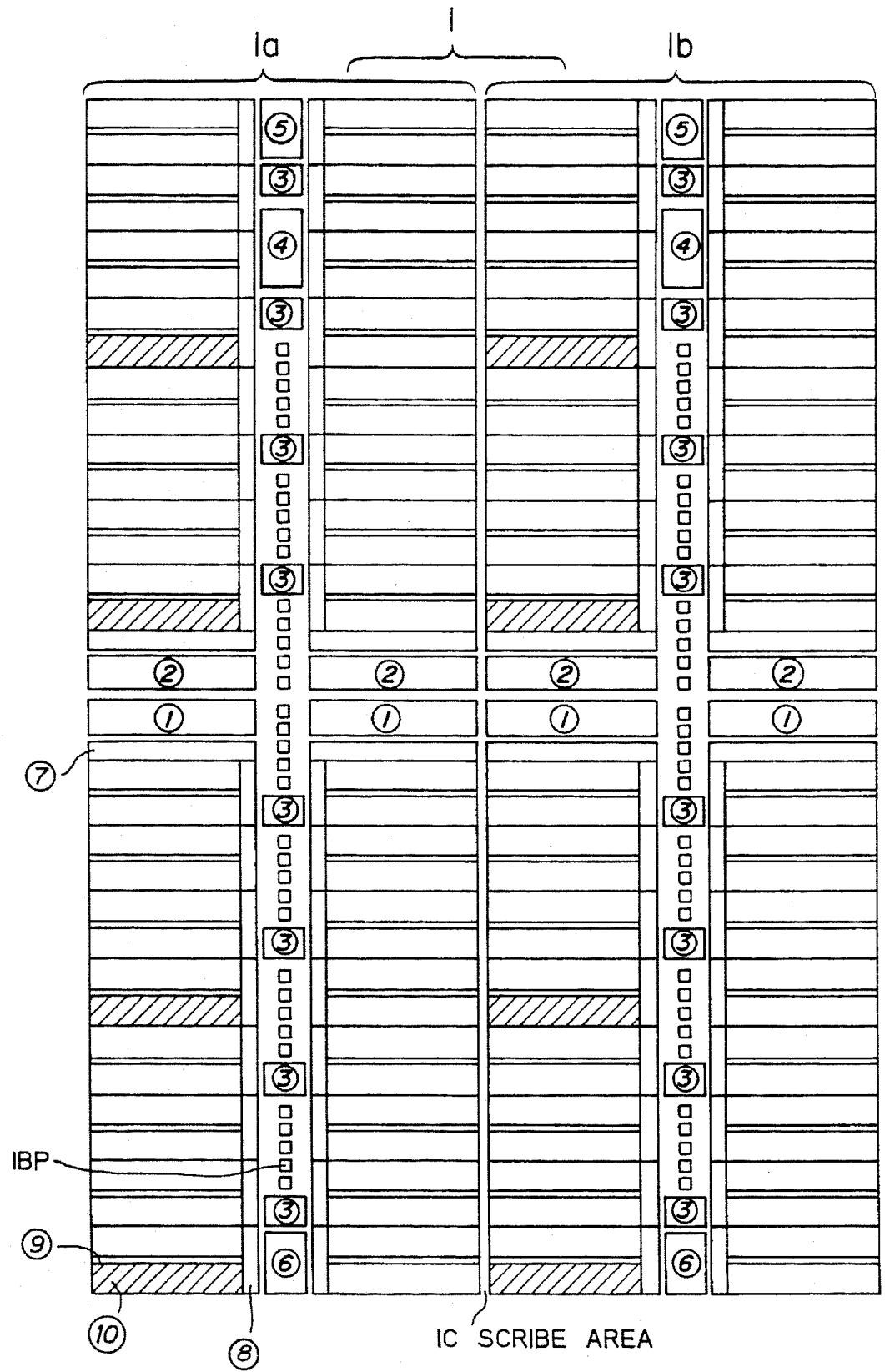
FIG. 18 is a plan view showing a layout of an optimum design for a 64 Mbit DRAM.

Further, as shown in FIG. 18 (a plan view showing an optimum design layout for the DRAM 1), the DRAM 1 is formed on a wafer by an optimum design and divided into two 32 Mbit DRAM sub-chips 1a and 1b by a scribe area 1C. Each of the DRAM sub-chips 1a and 1b has four I/O buffer circuits (eight I/Os). By combining these I/O buffer circuits, eight I/O circuits are formed (sixteen I/Os). Further, with the arrangement of the eight I/O buffer circuits in each of the DRAM sub-chips 1a and 1b, up to ×1 bit, ×4 bits, ×8 bits, and ×16 bits, can be realized through recombination of the wiring.

Arranged on those surfaces of the DRAM sub-chips on which circuits are formed (hereinafter referred to as the "main surfaces") are memory cell arrays and peripheral circuits. In the memory cell array, which is described in detail below, a plurality of memory cells each storing 1-bit of information are arranged in a matrix-like manner. The peripheral circuits consist of direct peripheral circuits and indirect peripheral circuits. The direct peripheral circuit is a circuit which directly controls the writing and reading of information to and from the memory cells. The direct peripheral circuit includes a row address decoder circuit, a column address decoder circuit, a sense amplifier circuit, etc. The indirect peripheral circuit is a circuit which indirectly controls the operation of the direct peripheral circuit. It includes a clock signal generation circuit, a buffer circuit, etc.

The layout shown in FIG. 18 includes address buffer circuits ①, clock circuits ②, main amplifier circuits ③, input/output (I/O) buffer circuits ④, Vbb generation circuits ⑤, word voltage generation circuits ③, input/output (I/O) buffer circuits ④, sense amplifier circuits ⑨, and memory arrays (512 Kbit arrays) ⑩. the reference symbol 1BP indicates bonding pads.

Examples of optimum designs will be described in the following:

(1) When a 64 Mbit DRAM is designed using four 16 Mbit DRAMs;

| Specifications for the 16 Mbit DRAMs | |
|---|---|
| Number of simultaneous operation bits: | 4096 bits |
| Number of times of refreshment: | 4096 times |
| Refreshment addresses: | 12 addresses |
| Test mode | 16 bits read simultaneously |
| 64 Mbit DRAM using four 16 Mbit DRAMs | |
| Number of simultaneous operation bits: | 16 kbits |
| Number of times of refreshment: | 4096 times |
| Refreshment addresses: | 12 addresses |
| Test mode | 64 bits read simultaneously |

(2) In the case where an optimum design is made for 16 Mbit DRAMs taking into account a 64 Mbit DRAM:

| Specifications for the 16 Mbit DRAMs | |
| --- | --- |
| Number of simultaneous operation bits: | 2048 bits |
| Number of times of refreshment: | 8192 times |
| Refreshment addresses: | 13 addresses |
| Test mode | 8 bits read simultaneously |
| 64 Mbit DRAM using four 16 Mbit DRAMs | |
| Number of simultaneous operation bits: | 8 kbits |
| Number of times of refreshment: | 8192 times |
| Refreshment addresses: | 13 addresses |
| Test mode | 32 bits read simultaneously |

Since the power consumption of a DRAM increases as the number of operation bits is augmented, the DRAM of the design (1) consumes more power than that of the design (2). Further, in the case of the design (1), the refreshment addresses are different from those in an ordinary DRAM, that is, this type of design lacks compatibility with ordinary DRAMs. In view of these problems, the present invention is concerned with the design (2).

Inner leads 2a are arranged on the respective main surfaces of the DRAM sub-chips 1a and 1b, i.e., on those surfaces on which the memory arrays ⑩ and peripheral circuits are arranged. Provided between these inner leads 2a and the DRAM sub-chips 1a and 1b are insulating films 3, which may consist, for example, of polyimide-type resin films. Adhesive layers (not shown) are provided on the surfaces of these insulating films 3, both on the side of the DRAM sub-chips 1a and 1b and on the side of the inner leads 2a. The material used for these adhesive layers may, for example, be a polyether-amide/imide-type resin or an epoxy-type resin.

Figure 19:
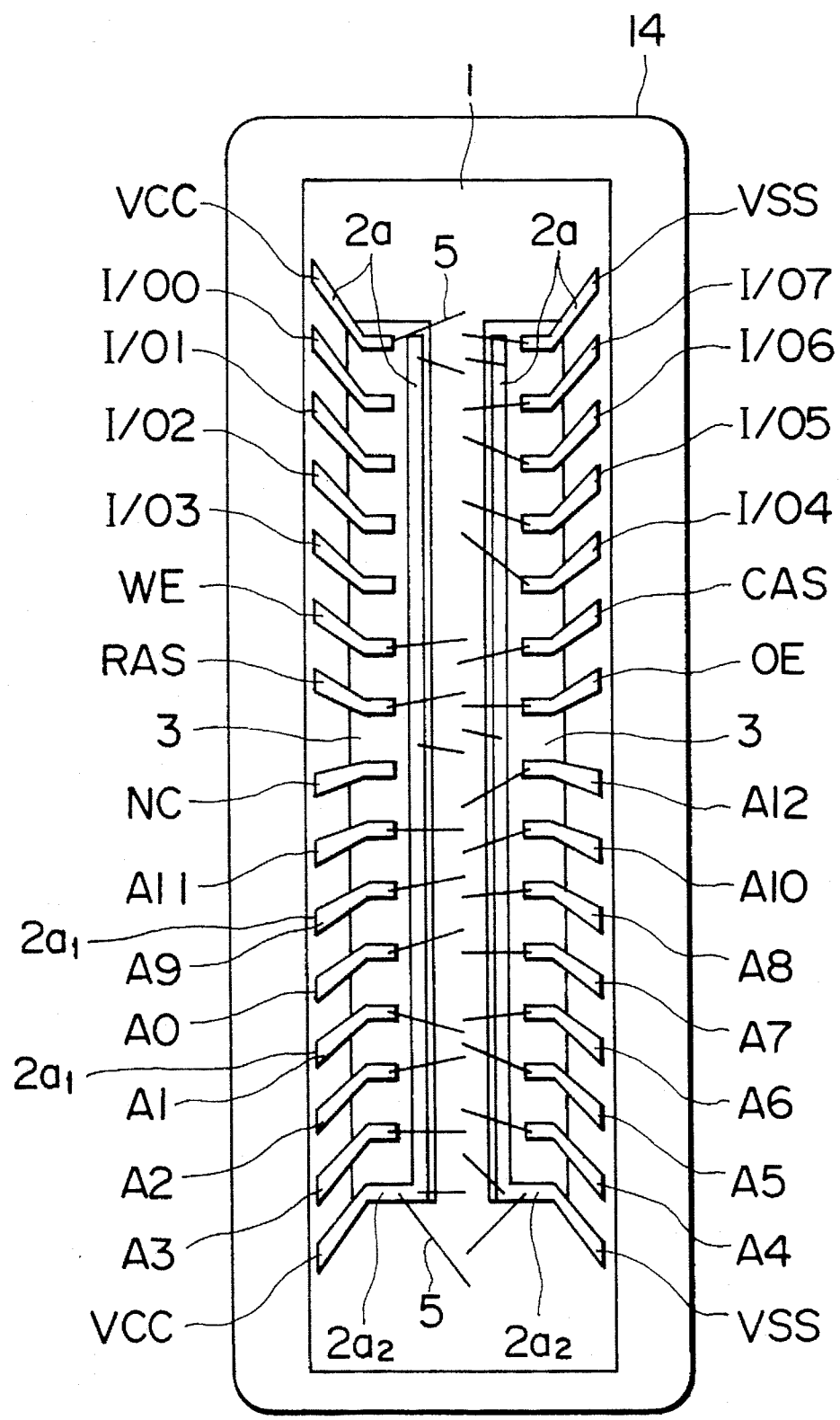
FIGS. 19 and 20 are illustrations of the electrical connection between electrodes of the chip and inner leads.
Figure 20:
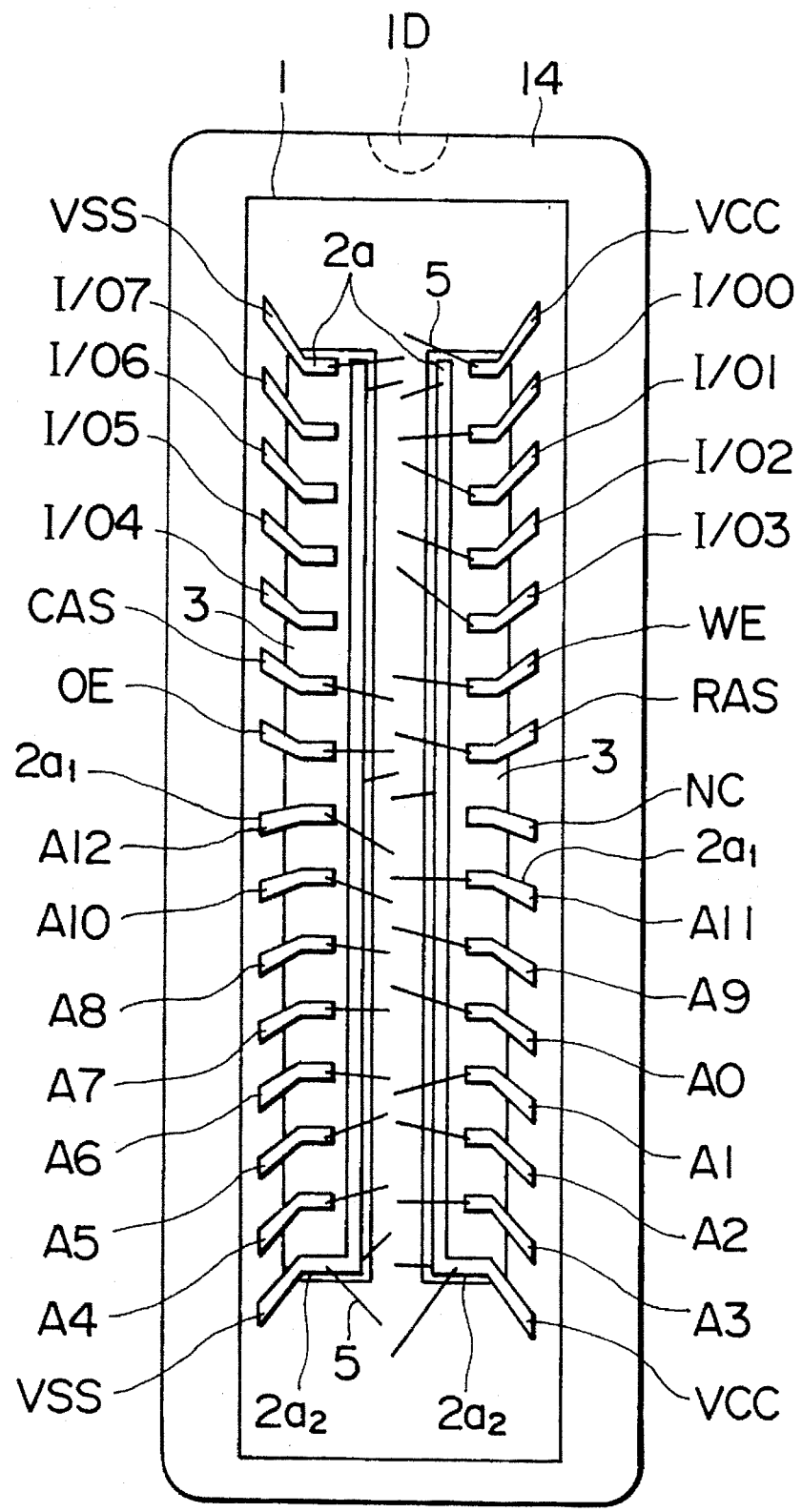

As shown in FIG. 18, bonding pads (external terminals) 1BP are provided in the center line sections in the longitudinal direction (the Y-direction) of the main surfaces of the DRAM sub-chips 1a and 1b. As shown in FIG. 19, on the DRAM sub-chip 1a, the electrical connection between these bonding pads 1BP and the inner leads 2a is effected according to the normal arrangement by wire bonding through bonding wires 5. And, as shown in FIG. 20, on the DRAM sub-chip 1b, the electrical connection between the bonding pads 1BP and the inner leads 2a is effected in a manner reverse to the normal arrangement by wire bonding through bonding wires 5.

Further, as shown in FIG. 2, the DRAM sub-chips 1a and 1b are layered one on top of the other in such a manner that each of the leads of one DRAM sub-chip has the same function as that lead of the other DRAM sub-chip to which it is connected.

This plastic-molding-type package 14 employs a LOC (Lead On Chip) structure in which inner leads 2a are arranged on both of the DRAM sub-chips 1a and 1b. In this plastic-molding-type package 14, which has the LOC structure, the inner leads 2a can be freely arranged without being restricted by the configuration of the DRAM sub-chips 1a and 1b. As a result, DRAMs 1 having a larger size can be packaged. In other words, with this plastic-molding-type package 14, the package size can be relatively small even when DRAMs 1 of a still larger size are used with a view to meeting the demand for a larger capacity. Thus, with this package structure, an improvement can be attained in terms of packaging density.

One end of each inner lead 2a is integrally formed with one of outer leads. Each outer lead is standardized and numbered, with the signal to be applied thereto being specified. In FIGS. 19 and 20, the reference numerals I/O0 to I/O7 indicate input terminals, A0 to A12 indicate address terminals, and the reference symbol Vcc indicates power voltage (Vcc) terminals. The power voltage Vcc may, for example, be an operation circuit voltage of 5V. The reference symbol WE indicates write enable signal terminals, RAS indicates row address strobe signal terminals, and Vss indicates reference voltage (Vss) terminals. The reference voltage Vss may, for example, be a circuit reference voltage of 0V. The reference symbols OE, CAS, and NC respectively indicate output enable signal terminals, column address strobe signal terminals, and dead terminals.

The other end section of each inner lead 2a extends across the respective longer sides of the rectangular DRAM sub-chips 1a and 1b to the central sections of these DRAM sub-chips. The tip of each of these other end sections of the inner leads 2a is connected through a bonding wire 5 to a bonding pad (an external terminal) 1BP arranged in the central section of the DRAM sub-chip 1a. The bonding wires 5 consist of aluminum (Al) wires. Alternatively, the bonding wires 5 may also consist of gold (Au) wires, copper (Cu) wires, metal wires coated with an insulating resin, etc. The bonding with the bonding wires 5 is effected by the bonding method in which thermocompression bonding and ultrasonic oscillation are utilized.

Those inner leads $2a_2$ which are integrally formed with the Vcc terminals of the inner leads 2a extend in the central sections of the DRAM sub-chips 1a and 1b in parallel with the longer sides of these sub-chips (These Vcc inner leads $2a_2$ are called "common inner leads" or "bus-bar inner leads"). Likewise, those inner leads $2a_2$ which are integrally formed with the Vss terminals of the inner leads 2a extend in the central sections of the DRAM sub-chips 1a and 1b in parallel with the longer sides of these sub-chips (These Vss inner leads $2a_2$ are called "common inner leads" or "bus-bar inner leads"). In each sub-chip, these common inner leads (Vcc) $2a_2$ and common inner leads (Vss) $2a_2$ extend parallel to each other within the domain defined by the other ends of the other inner leads 2a (the inner leads $2a_1$ for signals). These common inner leads (Vcc) $2a_2$ and common inner leads (Vss) $2a_2$ are so constructed that they can supply power voltage Vcc and reference voltage Vss to any position on the main surfaces of the DRAM sub-chips 1a and 1b. That is, this plastic-molded-type semiconductor device is so designed that it can absorb power noise with ease, thereby making it possible to augment the operating speed of the DRAM sub-chips 1a and 1b.

As shown in FIG. 20, in the DRAM sub-chip 1b, the inner leads 2a ($2a_1$ and $2a_2$) are cut off from the lead frame so that they may be lodged inside the plastic-molding-type package 2. These inner leads are joined with the inner leads 2a of the DRAM sub-chip 1a, with the outer leads being placed therebetween.

The lead frame may be formed, for example, of an Fe-Ni alloy (with an Ni content, for example, of 42 or 50%), Cu, etc.

The DRAM sub-chips 1a and 1b, the bonding wires 5, inner leads 2a, and the chip supporting leads (the suspension leads) are sealed in the molding resin 6, which is an epoxy-type resin containing, as additional ingredients, a phenol-type curing agent, silicon rubber and a filler so as to reduce stresses. The silicon rubber has the effect of lowering the coefficient of thermal expansion, as well as the elastic modulus, of the epoxy-type resin. The filler consists of spherical particles of silicon oxide and, like the silicon rubber, has the effect of lowering the coefficient of thermal expansion of the epoxy-type resin. Further, an index ID is provided at a predetermined position on the plastic-molding-type package 14.

In the lead frame of the first embodiment, the inner leads $2a_1$ for signals are arranged at equal intervals as shown in FIGS. 1, 19 (plan view) and 20 (plan view). By thus arranging the inner leads $2a_1$ for signals at equal intervals, the capacity for each inner lead $2a_1$ for signals can be kept constant, thereby reducing the influence of noise and augmenting the signal transmission speed.

Further, the attachment of the insulating films 3 to the respective main surfaces of the DRAM sub-chips 1a and 1b and the attachment of the insulating films 3 to the inner leads 2a are effected by means of an adhesive agent. It is also possible to use the adhesive agent only for the attachment of the insulating films 3 to the inner leads 2a and not to use it for the attachment of the films 3 to the main surfaces of the DRAM sub-chips 1a and 1b.

Next, it will be described how the DRAM sub-chips 1a and 1b are firmly attached to each other by means of an adhesive agent, with the lead frame being placed therebetween through the intermediation of the insulating films 3.

The inner leads $2a_1$ for signals, the common inner leads $2a_2$, and the suspension leads of the lead frame are respectively firmly attached to the inner leads $2a_1$ for signals, the common inner leads $2a_2$, and the suspension leads on the main surfaces of the DRAM sub-chips 1a and 1b by means of an adhesive agent, through the intermediation of the insulating films 3.

The connection between the lead frame and the bonding pads (the external terminals) 1BP in this embodiment is effected as follows.

As shown in FIG. 19, in the case of the DRAM sub-chip 1a (in which the leads are arranged according to the normal arrangement), the inner leads $2a_1$ for signals and the common inner leads $2a_2$ are electrically connected to this DRAM sub-chip 1a through the bonding wires 5.

And, as shown in FIG. 20, in the case of the DRAM sub-chip 1a (in which the lead pins are arranged in a manner reverse to the normal arrangement), the inner leads $2a_1$ for signals and the common inner leads $2a_2$ are likewise electrically connected to this DRAM sub-chip 1b through the bonding wires 5.

Thus, in accordance with this invention, bonding pads 1BP are provided in the central sections in the X- or Y-direction of the main surfaces of the DRAM sub-chips 1a and 1b, and the wire bonding on one of these sub-chips is effected in a manner reverse to the normal arrangement, whereby the DRAM sub-chips 1a and 1b can be joined and sealed together with ease in such a manner that each of the leads of one DRAM sub-chip has the same function as that lead on the other DRAM sub-chip to which it is connected.

What is claimed is:

1. A plastic-molded-type semiconductor device comprising: two semiconductor chips having main surfaces on which electrodes and circuits are formed and which are arranged to face each other; a lead frame comprised of a set of leads and placed between said two semiconductor chips; insulating films which are attached to at least a part of the main surfaces of said semiconductor chips except for said electrodes, after said semiconductor chips have been completely formed, wherein metallic wiring patterns are formed on said insulating films; said metallic wiring patterns being electrically connected to the electrodes of said semiconductor chips and to said lead frame; and a plastic package formed by plastic-sealing a part of said lead frame, said semiconductor chips, said insulating films and said metallic wiring patterns.

2. A plastic-molded type semiconductor device as claimed in claim 1, wherein the electrodes of said semiconductor chips are electrically connected to said metallic wiring patterns through wires.

3. A plastic-molded type semiconductor device as claimed in claim 1, wherein certain metal portions of said metallic wiring patterns extend beyond said insulating films and are electrically connected to the electrodes of said semiconductor chips by thermocompression bonding.

4. A plastic-molded type semiconductor device as claimed in claim 1, wherein said metallic wiring patterns are electrically connected to said lead frame by soldering.

5. A plastic-molded type semiconductor device as claimed in claim 4, wherein the melting point of a solder used in the soldering is not lower than 250° C.

6. A plastic-molded type semiconductor device as claimed in claim 1, wherein said metallic wiring patterns are electrically connected to said lead frame by means of an electrically conductive resin.

7. A plastic-molded type semiconductor device as claimed in claim 1, wherein said semiconductor chips have a rectangular configuration, and wherein the electrodes of each of these semiconductor chips are arranged in the vicinity of at least one of the two center lines of the semiconductor chips.

8. A plastic-molded type semiconductor device as claimed in claim 1, wherein said semiconductor chips are memory LSIs.

9. A plastic-molded type semiconductor device as claimed in claim 1, wherein said metallic wiring patterns are metallic foils.

10. A plastic-molded-type semiconductor device comprising: two semiconductor chips having main surfaces on which electrodes and circuits are formed and which are arranged to face each other; a lead frame consisting of a set of leads and placed between said two semiconductor chips; insulating films which are attached to at least a pair of the main surfaces of said semiconductor chips except for said electrodes after said semiconductor chips have been completely formed, wherein metallic wiring patterns are formed on said insulating films; said metallic wiring patterns being electrically connected through connecting portions to the electrodes of said semiconductor chips and to said lead frame, said connecting portions electrically connecting said metallic wiring patterns to said semiconductor chips, and those portions of the main surfaces of said semiconductor chips which are not covered with said insulating films being at least partially sealed with a first resin; and a plastic package formed by sealing a part of said lead frame, said semiconductor chips, said insulating films, said metallic wiring patterns, and said first resin with a second resin.

11. A plastic-molded type semiconductor device as claimed in claim 10, wherein the electrodes of said semiconductor chips are electrically connected to said metallic wiring patterns through wires.

12. A plastic-molded type semiconductor device as claimed in claim 10, wherein certain metal portions of said metallic wiring patterns extend beyond said insulating films and are electrically connected to the electrodes of said semiconductor chips by thermocompression bonding.

13. A plastic-molded type semiconductor device as claimed in claim 10, wherein said metallic wiring patterns are electrically connected to said lead frame by soldering.

14. A plastic molded type semiconductor device as claimed in claim 13, wherein the melting point of a solder used in the soldering is not lower than 250° C.

15. A plastic-molded type semiconductor device as claimed in claim 10, wherein said metallic wiring patterns are electrically connected to said lead frame by means of an electrically conductive resin.

16. A plastic-molded type semiconductor device as claimed in claim 10, wherein said semiconductor chips have a rectangular configuration, and wherein the electrodes of each of these semiconductor chips are arranged in the vicinity of at least one of the two center lines of the semiconductor chips.

17. A plastic-molded type semiconductor device as claimed in claim 10, wherein said semiconductor chips are memory LSIs.

18. A plastic-molded type semiconductor device as claimed in claim 10, wherein said metallic wiring patterns are metallic foils.

19. A plastic-molded-type semiconductor device according to claim 1, wherein said insulating films are bonded to said semiconductor chips.

20. A plastic-molded-type semiconductor device according to claim 10, wherein said insulating films are bonded to said semiconductor chips.

21. A plastic-molded-type semiconductor device comprising:

two semiconductor chips on which circuits are formed;

metallic wiring patterns attached to insulating films after said insulating films are attached to each surface of the chips after the semiconductor chips have been completely formed; electrodes on each of the semiconductor chips being electrically connected to the metallic wiring pattern with wires; said two semiconductor chips which have such a structure being faced toward each other so that both the surfaces on which circuits are formed are opposite to each other; lead frames placed between the two chips; and electrical conductive layers electrically connecting each wiring pattern to the lead frames; wherein the semiconductor chips, lead frames, and electrical conductive layers are molded by plastic.

22. A plastic-molded-type semiconductor device according to claim 21, wherein said insulating films are bonded to said semiconductor chips.

\* \* \* \* \*